United States Patent [19]
Saito

[11] Patent Number: 5,912,554
[45] Date of Patent: Jun. 15, 1999

[54] ELECTROMAGNETIC RADIATION MEASURING APPARATUS FOR HIGH FREQUENCY ANALYSIS OF RADIATION PRODUCED BY A CIRCUIT BOARD

[75] Inventor: Yutaka Saito, Ishikawa-ken, Japan

[73] Assignee: Matsushita Electric Industrial Co., Ltd., Osaka, Japan

[21] Appl. No.: 08/736,732

[22] Filed: Oct. 25, 1996

[30] Foreign Application Priority Data

| Oct. 30, 1995 | [JP] | Japan | 7-281961 |
| Oct. 30, 1995 | [JP] | Japan | 7-281962 |

[51] Int. Cl.⁶ ................................................. G01R 31/28
[52] U.S. Cl. ................................................................. 324/95
[58] Field of Search ........................... 324/95, 72.5, 538, 324/555, 501, 158.1, 73.1, 536, 537; 343/703

[56] References Cited

U.S. PATENT DOCUMENTS

| 4,829,238 | 5/1989 | Goulette et al. |
| 5,218,294 | 6/1993 | Soiferman ............................ 324/158.1 |

FOREIGN PATENT DOCUMENTS

| 0239251 | 9/1987 | European Pat. Off. |
| 4417031 | 8/1995 | Germany. |
| 50-067184 | 6/1975 | Japan. |
| 449586 | 11/1992 | Japan. |
| 567184 | 9/1993 | Japan. |

Primary Examiner—Vinh P. Nguyen
Attorney, Agent, or Firm—Pollock, Vande, Sande & Amernick

[57] ABSTRACT

An EM radiation measuring apparatus comprises an antenna element matrix on a substrate including 1st to Lth arrays which are successively arranged in an X direction, each of the 1st to Lth arrays including antenna elements arranged in a Y direction and having an output terminal, each antenna element receiving EM radiation from a target and generating a detection signal. A signal selector responsive to X and Y selection signals, selectively supplies the detection signal from one of antenna elements to one of the output terminals. 1st to Nth signal outputting circuits, each having inputs, at least an output, and at least a signal selection circuit selectively coupling the inputs to the output terminals of which the number is less than the number of the inputs. The Nth outputting circuit supplies an output detection signal, the inputs of the 1st signal outputting circuits being connected to the output terminals respectively, wherein each of the 2nd to Nth outputting circuits has a transmission line(s) substantially extending in the X direction to connect one of the input terminals thereof to at least the signal selection circuit thereof. The signal selector comprises diodes or transistors respectively connected to the antenna elements. The transistor amplifies the detection signal.

11 Claims, 7 Drawing Sheets a : 6~8mm
b : 4mm

ELECTROMAGNETIC RADIATION MEASURING APPARATUS FOR HIGH FREQUENCY ANALYSIS OF RADIATION PRODUCED BY A CIRCUIT BOARD

BACKGROUND OF THE INVENTION

1. Field of the Invention

This invention relates to an electromagnetic radiation measuring apparatus for measuring an electromagnetic radiation from an operated unit such as an operated circuit board.

2. Description of the Prior Art

An electromagnetic radiation measuring apparatus comprising two-dimensionally arranged probe elements for receiving electromagnetic radiation and a switching unit for successively supplying a detection signal from one of the probe elements to provide a two-dimensional electromagnetic detection result is known.

Such a prior art electromagnetic radiation measuring apparatus is disclosed in Japanese Patent Publication No. 5-67184. This prior art electromagnetic radiation measuring apparatus comprises a wire loop antenna matrix on a multi-layer print circuit board, each wire loop antenna detecting an electro-magnetic radiation and converting it into an electronic signal, and a switching circuit, including diodes, for successively outputting the electronic signal from one of the loop antenna.

FIG. 5 is a circuit diagram of a second prior art electromagnetic radiation measuring apparatus. FIG. 6 is a partial circuit diagram of a second prior art electro-magnetic radiation measuring apparatus. In FIGS. 5 and 6, electromagnetic radiation measuring arrays 104 are arranged in an X direction. Each of electromagnetic radiation measuring arrays includes a plurality (generally, 20 to 40) of wire loop antennas 101 and a switching, diode 103 forming an electromagnetic detection unit on a printed circuit board arranged in Y direction. A transmission line 102 in each electro-magnetic radiation measuring array is connected to cathodes of respective diodes. An electromagnetic radiation is detected by a wire loop antenna 101 and converted into an electric detection signal which is supplied to the transmission line 102 through the switching diode 103, wherein a selection in the Y direction is effected by applying a Y direction selection signal to a terminal 105 to turn on the corresponding switching diode 103. Therefore, the detection signal from the selected wire loop antennas is supplied to the transmission line 102 through the switching diodes 103. One end of each of the transmission lines 102 is terminated with a terminating element having a characteristic impedance (generally 50 ohms). The other ends of the respective transmission lines 102 are supplied to a signal selection portion 119 having a transmission line 121 and switching diodes 120. That is, the respective transmission lines 102 are coupled to the transmission line 121 extending in the X direction through the switching diodes 120. The transmission line 121 is so arranged as to be close to respective switching diodes 120.

When one of the switching diodes 120 is turned on the other switching diodes 120 are turned off to provide the selection in X direction. Therefore, the detection signal from one of loop antenna 101 is outputted.

In the second prior art, assuming that a switching diode 120a is turned on, because all other switching diodes 120 in the signal selection portion 119 are turned off, a portion A of the transmission line from the junction point between the switching diode 120a and the transmission line 121 to one end of the transmission line 121 acts as an open end transmission line. Therefore, This portion A shows a low impedance at a frequency corresponding to a wavelength λ g, wherein $$\lambda g = 4 \times A$$

Therefore, a transmission frequency characteristic of the signal selection portion 119 for selectively outputting one of outputs of the electromagnetic arrays is deteriorated. That is, this frequency limits the measurable high frequency (maximum frequency).

When it is desired to increase the maximum frequency, a positional measurable range is limited. To the contrary, if it is desired to expand the positional measurable range, the maximum frequency is limited. For example, it is assumed that a length of the transmission line is 200 mm. A maximum length of the open end line of the transmission line 21 is about 150 mm. Then, if the print circuit board has a general dielectric constant, the maximum measurable frequency is about 230 MHz. However, it is generally required that to the maximum measurable frequency of the electromagnetic radiation be from 30 MHz to 1 GHz. Therefore, if the maximum measurable frequency is required to be 1 GHz, the length of the transmission line 121 should be about 70 mm. Then, this provides an insufficient positional range for a general size of a print circuit board to be measured.

SUMMARY OF THE INVENTION

The aim of the present invention is to provide an improved electromagnetic radiation measuring apparatus.

According to this invention a first electromagnetic radiation measuring apparatus is provided, which comprises: a substrate (23); an antenna element matrix (20) on the substrate including first to Lth arrays (4) which are successively arranged in X direction at a predetermined interval, each of the first to Lth array including a plurality of antenna elements arranged in Y direction and having an output terminal (7), each antenna element receiving an electromagnetic radiation from a target and generating a detection signal; a signal selection portion (5, 3, 2, 7) on the substrate responsive to X and Y selection signals for selectively supplying the detection signal from one of antenna elements to one of the output terminals (7), the X selection signal determining one of the arrays, the Y selection signal determining one of the antenna elements (row) in the determined array; and first to Nth signal outputting circuits, each having inputs, at least an output, and at least a signal selection circuit selectively coupling the inputs to the output terminals of which the number is less than the number of the inputs, the Nth outputting circuit has only one of the output for supplying an output detection signal, the inputs of the first signal outputting circuits being connected to the output terminals (7) respectively, L and N being natural numbers more than one, wherein each of the second to Nth outputting circuits has at least a transmission line substantially extending in the X direction to connect one of the input terminals thereof to at least the signal selection circuit thereof.

The first electromagnetic radiation measuring apparatus may further comprise a frequency compensation portion (26) for compensating a frequency characteristic of the output detection signal and outputting a frequency compensated signal.

In the first electromagnetic radiation measuring apparatus, the first signal selection portion (5, 3, 39, 36) may comprise amplifying elements such as transistors on the substrate and arranged adjacent to respective antenna elements, each having one end connected to each of the antenna element and another end, some of amplifying elements is one of the first to Lth arrays are connected to the output terminal, each of amplifying elements connected to antenna elements in one of the first to Lth arrays are connected to the output terminal (42) of one of the first to Lth arrays, and each of amplifying elements selectively amplifies and selectively supplies the detection signal from one of the antenna elements to one of the output terminals (42) with an operation of each of amplifying elements controlled in response to the X and Y selection signals.

According to this invention a second electromagnetic radiation measuring apparatus is provided, which comprises: a substrate (23); an antenna element matrix (50) on the substrate including first to Lth arrays (38) which are successively arranged in X direction at a predetermined interval, each of the first to Lth arrays including a plurality of antenna elements arranged in Y direction and having an output terminal (42), each antenna element receiving an electromagnetic radiation from a target and generating a detection signal; a signal selection portion (39, 36, 47) on the substrate responsive to X and Y selection signals for selectively supplying the detection signal from one of the antenna elements to one of the output terminals (42), the X selection signal determining one of the arrays, the Y selection signal determining one of the antenna elements (row) in the determined array. A signal outputting portion, having inputs respectively connected to the output terminals (42) and an output (46) selectively couples one of the inputs to the output. The signal selection portion comprises amplifying elements on the substrate arranged adjacent to respective antenna elements, each having one end connected to each of the antenna elements and another end, connected to the output terminal, and each of amplifying elements selectively amplifies and selectively supplies the detection signal from one of antenna elements to one of the output terminals (42) with an operation of each of amplifying elements controlled in response to the X and Y selection signals.

According to this invention, a third electromagnetic radiation measuring apparatus is provided which comprises: a substrate (23); an antenna element matrix (50) on the substrate including a plurality of arrays (38) which are successively arranged in a X direction at a predetermined interval, each of the plurality of arrays including a plurality of antenna elements arranged in a Y direction and having an output terminal (42), each antenna element receives an electromagnetic radiation from a target and generates a detection signal. A signal selection portion (39, 36, 47) on the substrate responsive to X and Y selection signals selectively supplies the detection signal from one of the antenna elements to one of the output terminals (41), the X selection signal determining one of the arrays, the Y selection signal determining one of the antenna elements in the determined array. A signal outputting portion, has inputs respectively connected to the output terminals (41) and an output (46) selectively coupling one of the inputs to the output. The signal selection portion comprises amplifying elements on the substrate and arranged adjacent to respective antenna elements, each having one end connected to each of the antenna elements and another end. Each of the amplifying elements selectively amplifies and selectively supplies the detection signal from one of antenna elements to one of the output terminals (41) with an operation of each of amplifying elements controlled in response to the X and Y selection signals.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Figure 1:
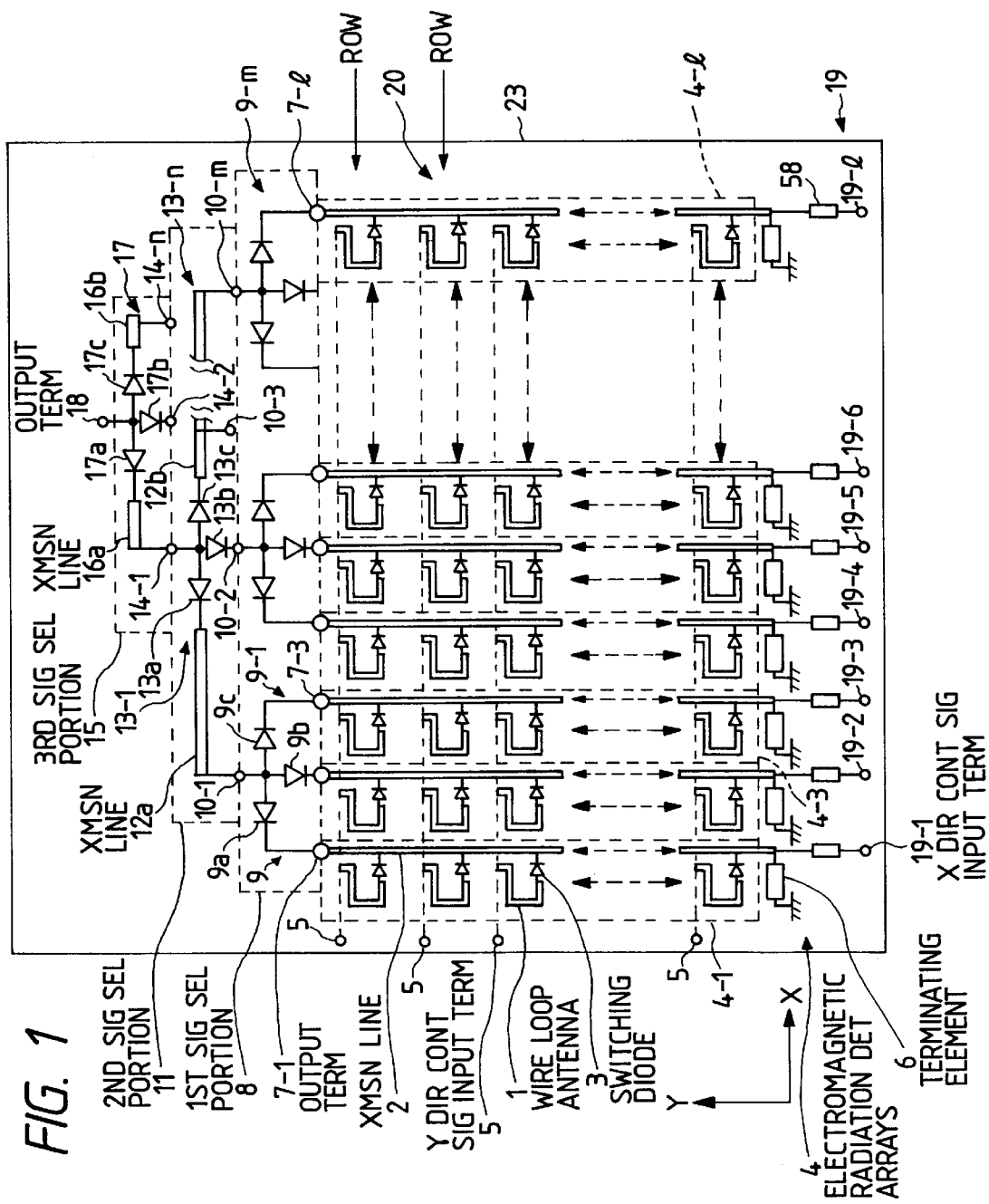
FIG. 1 is a circuit diagram of an electromagnetic radiation measuring apparatus of a first embodiment.
Figure 7:
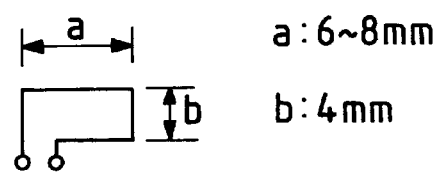
FIG. 7 is a plan view of a wire loop antenna of this invention.

Hereinbelow will be described a first embodiment of this invention. FIG. 1 is a circuit diagram of an electromagnetic radiation measuring apparatus of the first embodiment. Electromagnetic radiation measuring arrays 4 (4-1 to 4-1) are arranged in an X direction on a multi-layer print circuit board 23 (1 is a natural number, generally, 50). FIG. 7 is a plan view of a wire loop antenna of this invention. Each of electromagnetic radiation measuring arrays 4 includes a plurality of electromagnetic detection units 52 arranged, in a Y direction and a transmission line 2 on a printed circuit board 23. Each of electromagnetic detection units 52 includes a wire loop antenna 1 and switching diode 3. The transmission line 2 is connected to cathodes of respective switching diodes 3 and extends in the Y direction. The wire loop antennas 1 have a substantially rectangular shape having a width from 6 to 8 mm and a height of 4 mm and switching diodes 3.

Twenty to forty electromagnetic detection units 52 are arranged in each of electromagnetic radiation measuring arrays 4 and fifty of the electromagnetic radiation measuring arrays 4 are arranged in the antenna element matrix 20. Therefore, a thousand to two thousand of the electromagnetic detection units 52 are arranged in a matrix X-Y in an actual electromagnetic radiation measuring apparatus.

An electromagnetic radiation is detected by each wire loop antenna 1 and is converted into an electric detection signal supplied to the transmission line 2 through the switching diode 3. The selection in the Y direction is effected by applying a Y direction control signal as a bias voltage to one of Y direction control signal input terminals 5 corresponding to the wire loop antenna 1 from which a detection signal is to be detected. The application of the Y direction control signal to the Y direction control signal input terminal 5 turns on the corresponding switching diode 3. Therefore, the detection signal from the selected wire loop antennas 1 is supplied to the transmission line 2 through the switching diode 3. One end of each of the transmission lines 2 is terminated with a terminating element 6 having a characteristic impedance which is generally 50 ohms. Junction points between the transmission lines 2 and the terminating elements are connected to X direction control signal input terminals 19, respectively, through a dc resistive element 58 such as a resistor or a reactor. An X direction control signal is applied to one of X direction control signal input terminals 19 corresponding to the wire loop antenna 1 from which a detection signal is to be detected. The application of the X direction control signal having a low voltage or the ground level to the X direction control signal input terminal 19 selects one of the electromagnetic measuring arrays 4 including this wire loop antenna 1. Contrary, applying a supply voltage to the X direction control signal input terminal 19 turns off the switching diode 3. The other ends of the respective transmission lines 2 have output terminals 7-1 to 7-1 connected to a first signal selection portion 8. The first signal selection portion 8 includes m (a natural number) switching circuits 9, i.e., 9-1 to 9-m. The switching circuit 9-1 having switching diodes 9a to 9c of which cathodes respectively connected to output terminals 7-1 to 7-3 for supplying the detection signals from the selected electromagnetic radiation detection array 4 when one of the electromagnetic radiation detection arrays 4-1 to 4-3 is selected. Anodes of the switching diodes 9a to 9c are connected to an output terminal 10-1. Other switching circuits 9-2 to 9-m have the similar structure and operation for supplying the detection signals from the selected electromagnetic radiation detection array 4 when one of the electromagnetic radiation detection arrays 4 coupled to the switching circuit 9 is selected. Therefore, the first signal selection portion 8 supplies one of the detection signal from 1 output terminals 7-1 to 7-1 to m output terminals 10-1 to 10-m (l>m).

The switching circuits 9-1 to 9-m have output terminals 10-1 to 10-m respectively. The output terminals 10-1 to 10-m are connected to a second signal selection (outputting) portion 11 including switching circuit 13-1 to 13-n (n is a natural number and l>m>n). The output terminals 10-1 to 10-3 are respectively coupled to cathodes of diodes 13a to 13c, wherein the cathodes of diodes 13a and 13c are coupled to the output terminals 10-1 and 10-3 through transmission lines 12a and 12b respectively but the cathode of the diode 13b is directly connected to the output terminal 10-2. Anodes of the switching diodes 13a to 13c are connected to an output terminal 14-1. The other switching circuits 13-2 to 13-n are similarly connected. Therefore, the second signal selection portion 11 supplies one of the detection signals from m output terminals 10-1 to 10-m to one of n output terminals 14-1 to 14-n (m>n).

The switching circuits 13-1 to 13-n have output terminals 14-1 to 14-n respectively. The output terminals 14-1 to 14-n are connected to a third signal selection portion 15, i.e., a final stage of signal selection portion in this embodiment, including switching circuit 17. That is, the output terminals 14-1 to 14-n (n=3, in this embodiment) are coupled to cathodes of diodes 17a to 17c, wherein the cathodes of diodes 17a and 17c are coupled to the output terminals 14-1 and 14-3 (14-n) through transmission line 16a and 16b but the cathode of the diode 17b is directly connected to the output terminal 14-2. The final stage of signal selection portion 15 has one output terminal 18, connected to anodes the switching diodes 17a to 17c, for supplying the detection signal from one of wire loop antenna 1 as an output detection signal of this electromagnetic radiation measuring apparatus. In this embodiment, there are three stages of the signal selection portions. However, this structure can be hierarchically expanded in accordance with the number of the electromagnetic detection units 52.

The transmission lines 12a, 12b, 16a and 16, etc. couple the output terminals to the diodes with the shortest distances. That is, these extend in the X direction. Leads of diodes 9a and 9c from the cathodes can be considered as transmission lines also.

An operation of this embodiment will be described.

A target print circuit board (not shown in FIG. 1) is arranged to confront the print circuit board 23 of this electromagnetic radiation measuring apparatus with a predetermined space and the target print circuit board is operated. The output terminal 18 is coupled to a measuring instrument such as a spectrum analyzer or the like. Then, the Y direction control signal and the X direction control signal (L level) are selectively supplied to one of the Y direction control signal input terminals 5 and to one of the X direction control signal input terminals 19-1 to 19-1. The Y direction control signal has a bias voltage to turn on the switching diodes 3 on the same row (ROW) connected to the same Y direction control signal input terminal 5. When the X direction control signal is Low voltage (the ground level) supplied to one of X direction control signal input terminals 19 and a bias current from one of the wire loop antennas 1 on the row to which the Y direction control signal is supplied flows. That is, a bias current flows through the wire loop antenna supplied with both the Y direction control signal and the X direction control signal.

The electromagnetic radiation received by one loop antenna 1 is converted into an ac detection signal on the bias current, and the ac detection signal is supplied to the output terminal 7. Then, a detection signal from one wire loop antenna 1 corresponding to the X direction control signal input terminal 19 and the corresponding Y direction control signal input terminal 5 is outputted at the output terminal 18 via one of the output terminal 7-1 to 7-1, one of the switching diodes in the first signal selection portion 8, one of output terminals 10-1 to 10-m, one of switching diodes in the second signals selection portion 11, one of output terminals 14-1 to 14-m, one of switching diodes in the third signal selection portion 15 with a unique signal passage formed. Application of the X direction control signal and the Y direction control signal is successively changed such that all wire loop antennas 1 arranged in a matrix are scanned. The measuring instrument observes the detection signal from the output terminal 18 in phase with this scanning operation and can output a frequency spectrum analysis indicative of electromagnetic radiation from respective points of the target printed circuit board, i.e. an electromagnetic radiation intensity distribution of the target printed circuit board 25.

In the first to third signal selection portions 8, 11, and 15, there is no open-end transmission line during the detection signal passes therethrough, so that the transmission characteristic in the signal selection portions are improved. That is, the electromagnetic measurement up to a higher frequency can be obtained with the same circuit board size and the same resolution.

In the above-mentioned embodiment, there are three stages of the signal selection portions. However, this structure can be hierarchically expanded to increase the number 1 of the electromagnetic radiation detection arrays. Moreover, there are three switching diodes in each of switching circuits in the first to third signal selection portion 8, 11, and 15. It is also possible to increase the number of the switching diodes with a consideration of the frequency characteristic. In this embodiment, the switching diodes are used in the first to third signal selection portions 8, 11, and 15. However, FETs (field effect transistors) or the like can be used in place of the switching diodes.

A modification of the first embodiment will be described.

Figure 8:
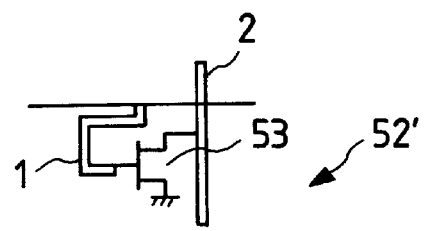
FIGS. 8 an 9 are partial circuit diagrams of modification of the first embodiment and are also referred in the third embodiment.

FIGS. 8 an 9 are partial circuit diagrams of modification of the first embodiment and will be also referred in the third embodiment. In FIG. 8, the an FET 53 having a gate connected to the wire loop antenna, a source connected to the transmission line, and a drain grounded replaces the switching diode 3. The FET 53 and the wire loop antenna 1 forms an an electromagnetic detection unit 52' for selectively outputting a detection signal in accordance wit the Y direction control signal and the X direction control signal similarly.

Figure 9:
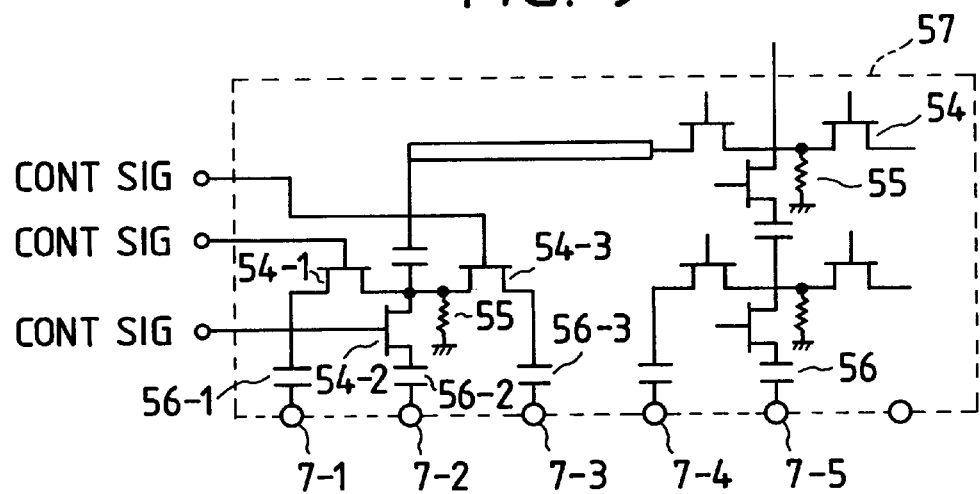

In FIG. 9, a signal selection circuit 57 including FETs as switching elements replaces the signal selection portions 8 and 9. The FETs 54-1 to 54-3 require a bias resistor 55 and between the output terminals 7-1 to 7-3 and FETs 54-1 to 54-3 ac coupling capacitors 56-1 to 56-3 are provided. Each of the FETs 54 is controlled by a control signal externally supplied.

A second embodiment will be described.

Figure 2:
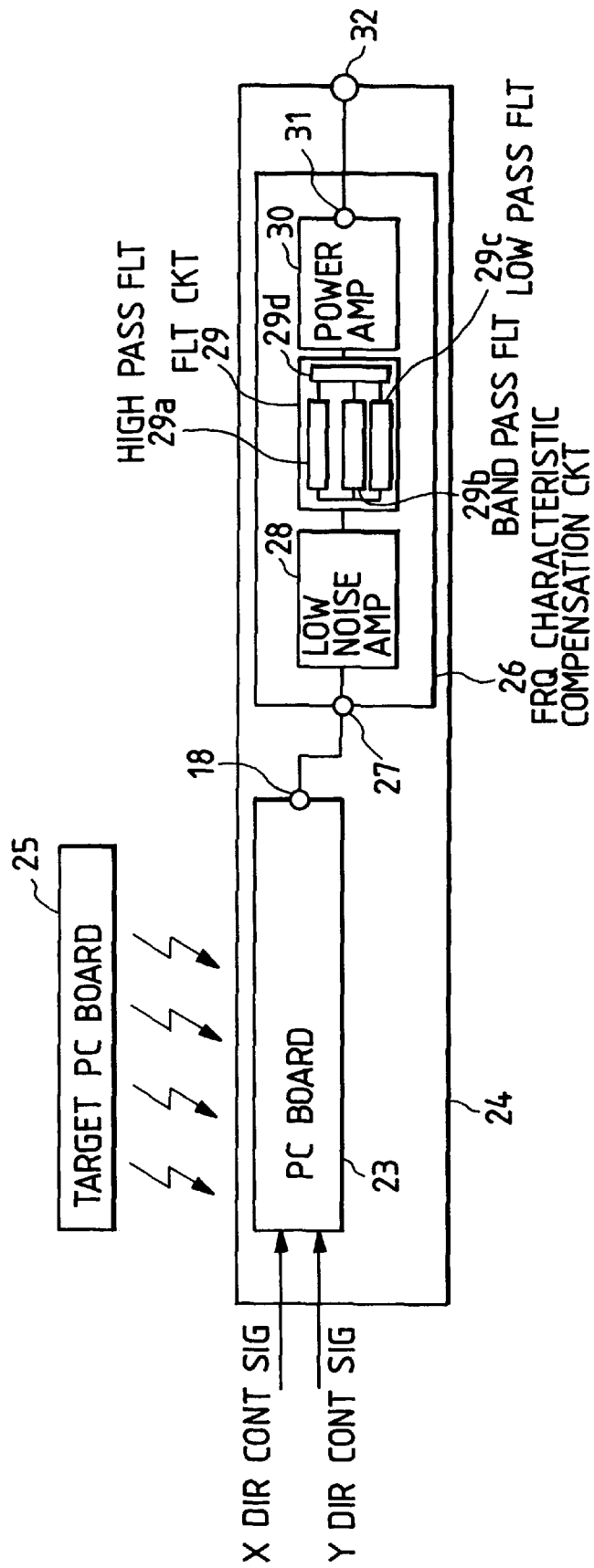
FIG. 2 is a block diagram of an electromagnetic radiation measuring apparatus of a second embodiment.

FIG. 2 is a block diagram of an electromagnetic radiation measuring apparatus of the second embodiment. The electromagnetic radiation measuring apparatus of the second embodiment comprises the multi-layer printed circuit 23 having the circuit structure shown in FIG. 1 for detecting electromagnetic radiation from a target printed circuit board 25, a frequency characteristic compensation circuit 26 coupled to the output terminal 18 on the printed circuit board 23 via an input terminal 27 thereof for compensating a frequency characteristic of the detection signal and for outputting a frequency compensated detection signal at an output terminal 32. The frequency characteristic compensation circuit 25 comprises a low noise amplifier 28 for amplifying the detection signal from the output terminal 18, a filter circuit 29, including a low pass filter 29c, at least a band pass filter 29b, and a high pass filter 29a, and an amplifier 29d for combining these filters, for compensating a frequency characteristic of the detection signal, and a power amplifier 30 for outputting the frequency compensated detection signal at an output terminal 32.

An operation of the second embodiment will be described.

A target print circuit board 25 is arranged to confront the print circuit board 23 of this electromagnetic radiation measuring apparatus with a predetermined space and the target print circuit board 25 is operated. The print circuit board 23 and the frequency characteristic circuit 26 are mounted in a case 24. The output terminal 32 is coupled to the measuring instrument mentioned in the first embodiment such as the spectrum analyzer or the like. Then, the Y direction control signal and the X direction control signal are selectively supplied to one of the Y direction control signal input terminals 5 and to the X direction control signal input terminals 19-1 to 19-1. A detection signal from one wire loop antenna 1 corresponding to the X direction control signal input terminal 19 and the corresponding Y direction control signal input terminal 5 is outputted at the output terminal 18. The application of the X direction control signal and the Y direction control signal is successively changed such that all wire loop antennas 1 arranged in a matrix are scanned.

The frequency characteristic compensation circuit 26 compensates the frequency characteristic of the detection signal from the output terminal 18 and supplies the frequency characteristic compensated detection signal to the external measuring instrument.

The measuring instrument can provide a map of a frequency spectrum analysis indicative of electromagnetic radiation from respective points of the target printed circuit board with a frequency compensation.

The low noise amplifier 28 amplifies the detection signal from the output terminal 18 with a flat frequency characteristic gain over a wide frequency range. The filter circuit 29 compensates the frequency characteristic of the detection signal from the low noise amplifier 28 through a combination of the low pass filter 29c, a band pass filter(s) 29b, and the high pass filter 29a to obtain a flat frequency characteristic in the detection signal over a required frequency range. The power amplifier 31 amplifies the frequency compensated signal to output the frequency compensated signal with a sufficient power with a sufficient low impedance.

Figure 3:
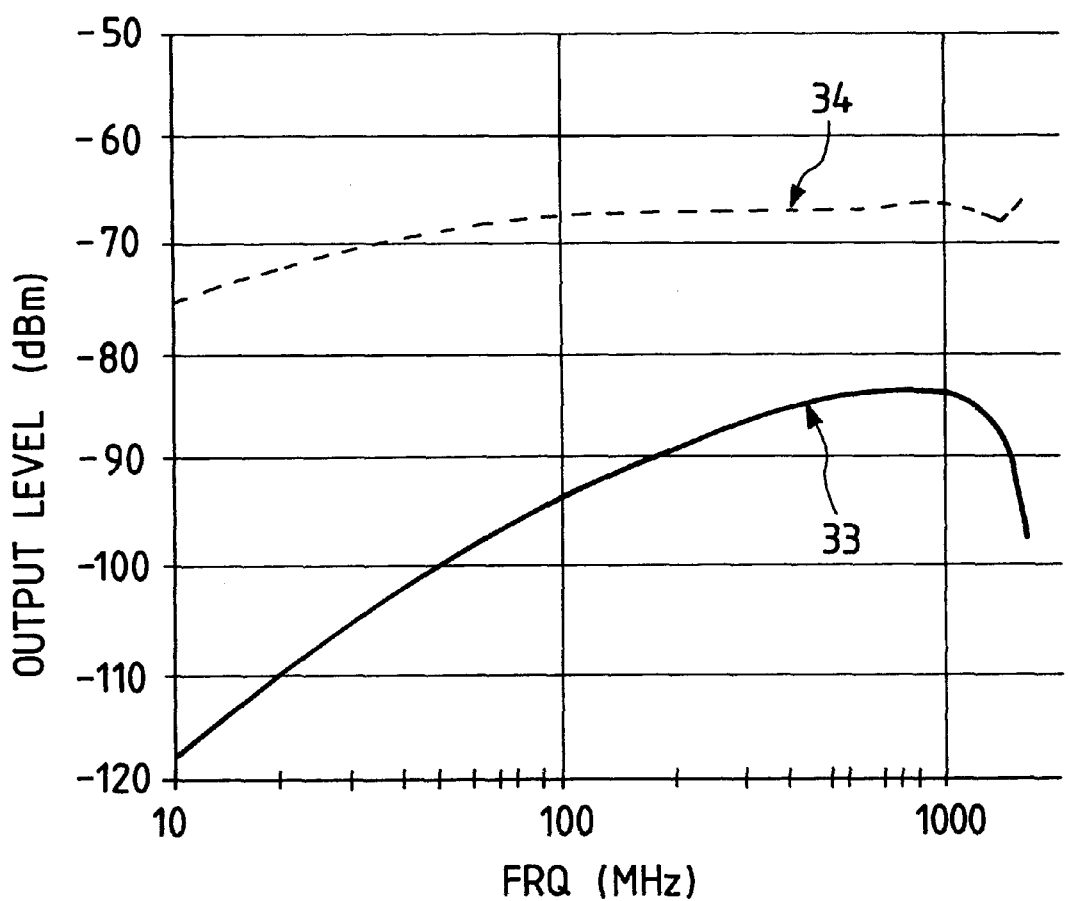
FIG. 3 is a diagram of a frequency characteristic of the second embodiment.

FIG. 3 is a diagram of a frequency characteristic of the second embodiment. A curve 33 represents a frequency characteristic of the detection signal at the output terminal 18. A curve 34 represents a frequency characteristic of the frequency-characteristic-compensated detection signal at the output terminal 32 in the condition that the frequency characteristic compensation circuit has a total gain from about 18 to 40 dB. As the result, the frequency characteristic of the detection signal is compensated to have a flat frequency characteristic around the level of −70 dBm with a variation within about 10 dbm and this electromagnetic radiation measuring apparatus provides the detection signal up to 1,500 MHz.

Figure 4:
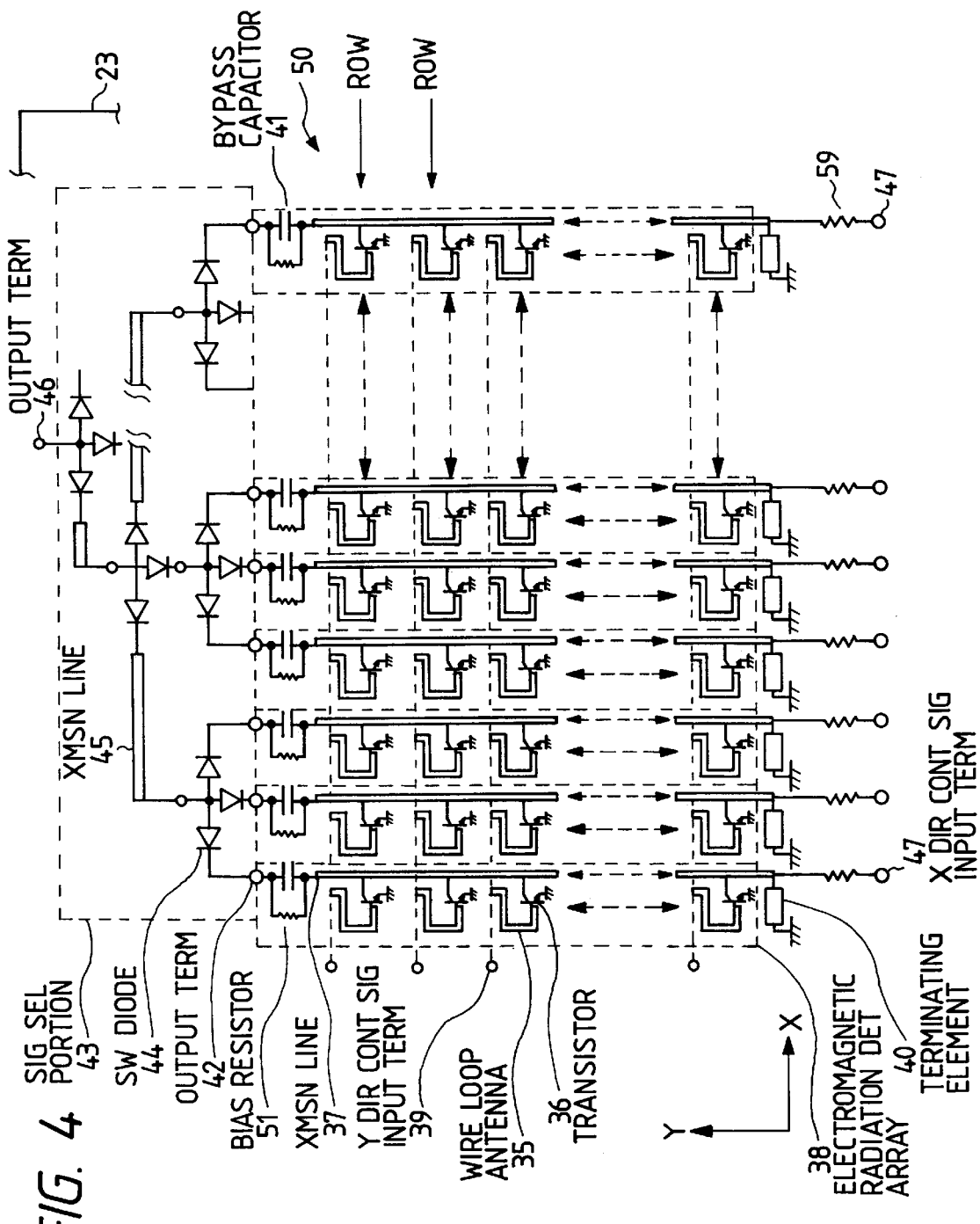
FIG. 4 is a circuit diagram of an electromagnetic radiation measuring apparatus of a third embodiment.

Hereinbelow will be described a third embodiment of this invention. FIG. 4 is a circuit diagram of an electromagnetic radiation measuring apparatus of the third embodiment. Electromagnetic radiation measuring arrays 38 are arranged in the X direction on a multi-layer print circuit board 23. Each of electromagnetic radiation measuring arrays 38 includes wire loop antennas 1, transistors 36, and a transmission line 37. Each of the wire loop antennas 1 and each of transistors 36 form an electromagnetic detection unit. The wire loop antenna 1 has the shape as shown in FIG. 7 similar to the first embodiment.

A base of each transistors 36 is connected to one end of each wire loop antenna 35, the emitter of the transistor 36 is grounded, and the collectors of the transistors 36 in the same electromagnetic radiation measuring arrays 38 are commonly connected to one transmission line 37. The output terminal 42 is coupled to a cathode of the switching diode 44 through a bias resistor 51 and a bypass capacitor 41 connected to the bias resistor 51 in parallel.

In the actual circuit, generally, twenty to forty electromagnetic radiation detection arrays are arranged in X direction and fifty electromagnetic units are arranged in each of the electromagnetic radiation detection arrays. Therefore, a thousand to two thousands of the electromagnetic detection units are arranged in a matrix X-Y in the actual electromagnetic radiation measuring apparatus.

An electromagnetic radiation is detected by each wire loop antenna 1 and is converted into an electric detection signal supplied to the transmission line 37 through the transistor 36 when the transistor 36 is activated by the X and Y direction control signals. That is, the selection in the Y direction is effected by applying a Y direction control signal 39 as a bias current to a Y direction control signal input terminal 39 corresponding to the wire loop antenna from which detection signal is to be detected. The application of the Y direction control signal to the Y direction control signal activates the corresponding transistor 36 together with the X direction control signal. Therefore, the detection signals from the selected wire loop antenna 35 is supplied to the transmission line 37 through the transistor 36. One end of each of the transmission lines 37 is terminated with a terminating element 40 having a characteristic impedance which is generally 50 ohms. Junction points between the transmission lines 37 and the terminating elements 40 are connected to X direction control signal input terminals 47 through resistors 59 respectively. An X direction control signal having a low level is applied to one of the X direction control signal input terminals 47 corresponding to the wire loop antenna 1 from which the detection signal is to be detected. The application of the X direction control signal to the X direction control signal input terminal 47 to select one of the electromagnetic measuring arrays 38 including this wire loop antenna 35. The other ends of the respective transmission lines 37 are coupled to output terminals 42 through the bypass capacitors 41. The output terminals 42 are connected to a signal selection portion 43. The signal selection portion 43 includes switching circuits having switching diodes 44 operating as similar to the first embodiment to output the detection signal at the output terminal 46.

An operation of this embodiment will be described.

A target print circuit board (not shown in FIG. 4) is arranged to confront the print circuit board of this electromagnetic radiation measuring apparatus with a predetermined space and the target print circuit board is operated. The output terminal 46 is coupled to a measuring instrument such as a spectrum analyzer or the like. Then, the Y direction control signal and the X direction control signal are selectively supplied to one of the Y direction control signal input terminals 39 and to the X direction control signal input terminals 47. The Y direction control signal has a bias voltage supplied through a suitable bias resistance to a base of transistors 36 on the same row of the electromagnetic radiation detection units connected to the same Y direction control signal input terminal 39. When the X direction control signal is a LOW voltage or the ground level supplied to one of X direction control signal input through the resistor 59, the switching diode 44 turns on through a bias resistor 51 and a current including a bias current and an electromagnetic radiation detection current from one of the wire loop antennas 1 on the row to which the Y direction control signal is supplied to the base of the transistors 36. Then, only the transistor supplied with the X and Y direction control signals amplifies the base current. An ac component, that is, a magnetic radiation detection signal, in the amplified current is coupled to the bypass capacitor 41 as the detection signal to the output terminal 46. Then, the application of the X direction control signal and the Y direction control signal is successively changed such that all wire loop antennas 35 arranged in a matrix are scanned. The measuring instrument observes the detection signal from the output terminal 46 in phase with this scanning operation and can output a map of a frequency spectrum analysis indicative of electromagnetic radiation from respective points of the target printed circuit board, i.e. an electromagnetic radiation intensity distribution of the target printed circuit board 25.

As mentioned, the detection signal is amplified by the transistor 36 provided adjacent to the wire loop antenna, i.e., directly connected to the wire loop antenna, with a gain from 5 dB to 10 dB, so that a dynamic range of the detection signal is increased. Moreover, the sensitivity of the wire loop antenna 36 is increased by the transistor 36, so that it is possible to make the size of the wire loop antenna 35 smaller. Then, the smaller size of the wire loop antenna 35 provides a sensitivity to higher frequency, for example, 2 GHz, so that the frequency characteristic of the electromagnetic radiation measuring apparatus can be improved. Moreover, the smaller size of the wire loop antenna 35 provides a higher resolution of the electromagnetic radiation measuring.

In this embodiment, the transistor 36 is used as the switching and amplifying element. However, other amplifying element such as FETs can be used also. That is the FET shown in FIG. 8 can be used in place of the transistor 36. Moreover, the signal selection portion 43 uses the switching diodes 44. However, the FETs 54 shown in FIG. 9 can be also used in place of the switching diodes 44.

Figure 5:
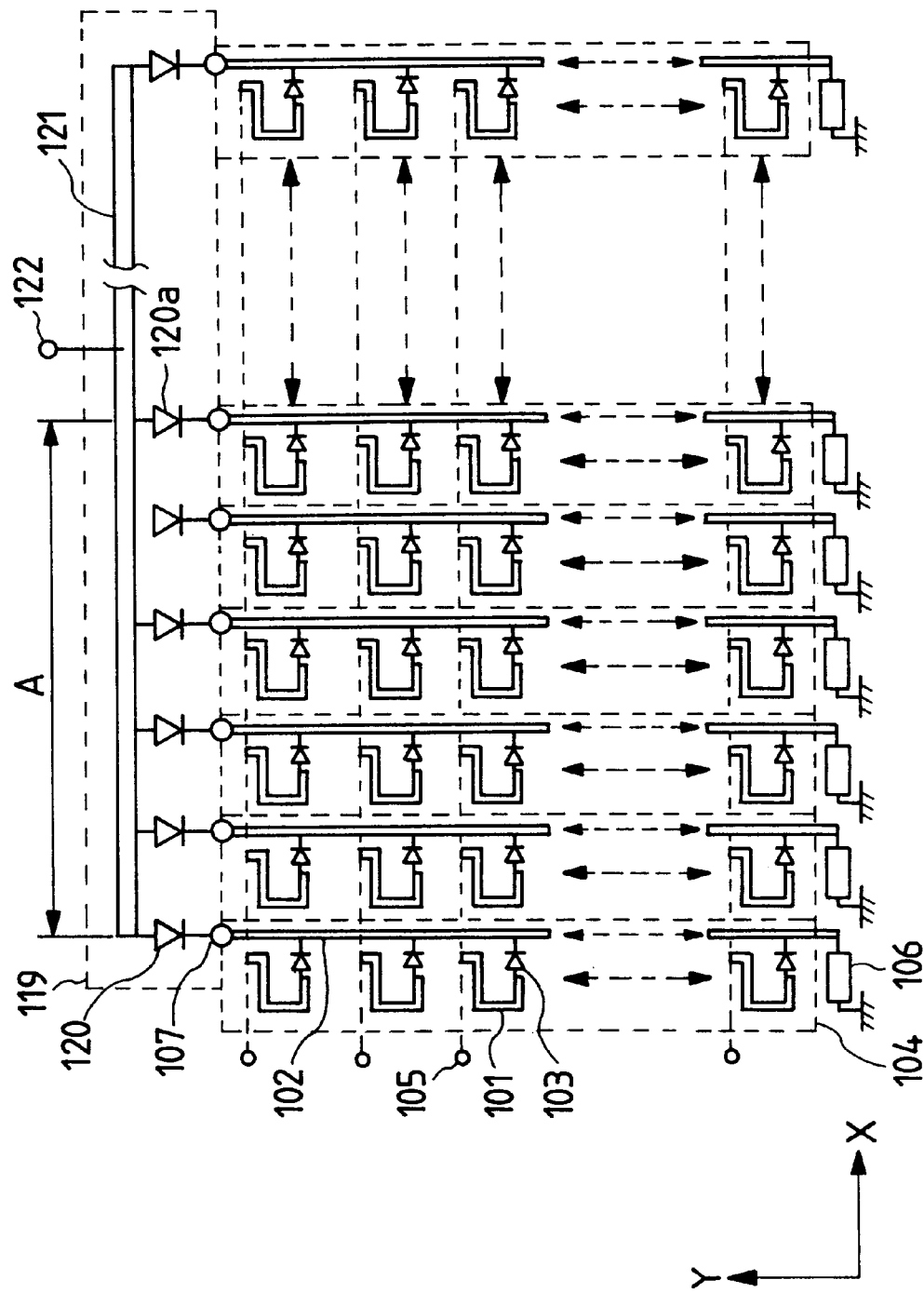
FIG. 5 is a circuit diagram of a second prior art electromagnetic radiation measuring apparatus.
Figure 6:
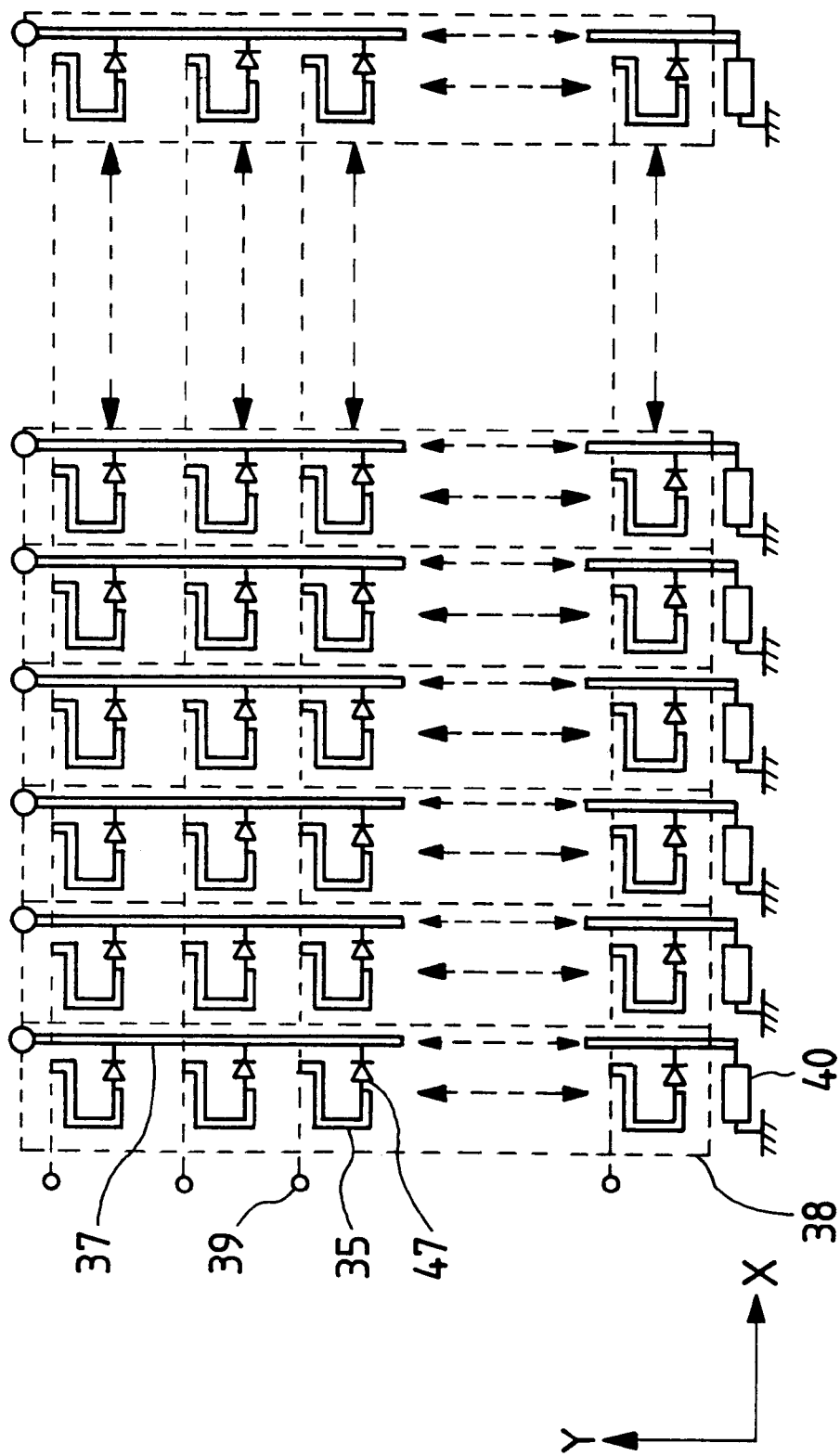
FIG. 6 is a partial circuit diagram of the second prior art electro-magnetic radiation measuring apparatus.

In the third embodiments, the signal selection portion 43 has the hierarchically structured switching circuits. However, the feature that the detection signal is amplified by adjacent transistor 36 can be also effected in the case that the switching circuit used in the prior art shown in FIG. 5.

What is claimed is:

1. An electromagnetic radiation measuring apparatus comprising:

a substrate (23);

an antenna element matrix (20) on said substrate including first to Lth arrays (4) which are successively arranged in an X direction at a predetermined interval, each of said first to Lth array including a plurality of antenna elements arranged in a Y direction and having an output terminal (7), each antenna element receiving an electromagnetic radiation from a target and generating a detection signal;

signal selection means (5, 3, 2, 7) on said substrate responsive to X and Y selection signals for selectively supplying said detection signal from one of antenna elements to one of said output terminals (7), said X selection signal determining one of said arrays, said Y selection signal determining one of said antenna elements in said determined array;

a plurality of first outputting circuits, each having an output and plural inputs connected to the output terminals of said first to Lth arrays, said each of outputting circuits having a selection circuit which operates to connect one of its inputs to a respective output;

second outputting circuits, each having an output, and plural inputs connected to an output of said plurality of first outputting circuits through plural transmission lines which extend along one predetermined direction, and a signal selection circuit for connecting one of said second outputting circuit inputs to a respective output; and a third output circuit having an output, and plural inputs connected to outputs of said second outputting circuits by transmission lines which extend in said predetermined direction, and a selection circuit for connecting one of said inputs to said output.

2. An electromagnetic radiation measuring apparatus as claimed in claim 1, wherein said signal selection circuit of said first outputting circuit comprises a first signal selection element (9a) having one end connected to said output terminal of said first array and the other end connected to one of the outputs of said first outputting circuit, a second signal selection element (9b) having one end connected to said output terminal of a second array neighboring with said first array and the other end connected to said one of outputs of said first outputting circuit, and said second outputting circuit having first and second transmission lines (12a, 12b) connecting respective inputs to outputs of said first outputting circuit, a third signal selection element (13a) having one end coupled to said output terminal of said first outputting circuit through said first transmission line (12a) and the other end connected to an output of said second outputting circuit, a fourth signal selection element (13c) having one end connected to one of said outputs of said second outputting circuits and the other end connected to an output of another first outputting circuit through said second transmission line (12b).

3. An electromagnetic radiation measuring apparatus as claimed in claim 2, wherein each of said first and second signal selection elements comprises a diode.

4. An electromagnetic radiation measuring apparatus as claimed in claim 2, wherein each of said first and second signal selection elements comprises a transistor.

5. An electromagnetic radiation measuring apparatus as claimed in claim 1, wherein each of at least said signal selection circuit of said first signal selection circuit further comprises at least a fifth signal selection element (9c) having one end connected to an output terminal of a third array neighboring with said second array and the other end connected said one of outputs of said first outputting circuit and said second outputting circuit further comprises at least a sixth signal selection element (13b) having one end coupled to another output of another first outputting circuit.

6. An electromagnetic radiation measuring apparatus as claimed in claim 1, wherein said selection means comprises switching elements on said substrate and arranged adjacent to respective antenna elements, each having one end connected to each output terminal of said antenna elements and another end connected to each output terminal of said first to Lth arrays.

7. An electromagnetic radiation measuring apparatus as claimed in claim 6, wherein each of said switching elements comprises a diode.

8. An electromagnetic radiation measuring apparatus as claimed in claim 6, wherein each of said switching elements comprises a transistor.

9. An electromagnetic radiation measuring apparatus as claimed in claim 1, further comprising a frequency compensation means for compensating a frequency characteristic of said output signal and outputting a frequency compensated signal.

10. An electromagnetic radiation measuring apparatus as claimed in claim 9, wherein said frequency compensation means includes a broad band amplifier (28) for amplifying said output signal, a high pass filter (29a) for high-pass filtering an output of said broad band amplifier, a band pass filter (29b) for band-pass filtering said output of said broad band amplifier, a low pass filter for low-pass filtering said output of said broad band amplifier (29c), and an output circuit (29c) for providing said frequency compensated signal from said outputs of said high pass filter, band pass filter, and said low pass filter.

11. An electromagnetic radiation measuring apparatus as claimed in claim 1, wherein said first signal selection means (5, 3, 39, 36) comprises amplifying elements on said substrate and arranged adjacent to respective antenna elements, each having one end connected to each of said antenna element and another end connected to said output terminal of a respective array, wherein each of amplifying elements selectively amplifies and selectively supplies said detection signal from one of said antenna elements to one of said output terminals (42) in response to said X and Y selection signals.

* * * * *